United States Patent
Bieri et al.

(10) Patent No.: US 8,274,285 B2
(45) Date of Patent: Sep. 25, 2012

(54) MODIFICATION OF FREQUENCY RESPONSE PROFILES OF STEADY STATE FREE PRECESSION FOR MAGNETIC RESONANCE IMAGING (MRI)

(75) Inventors: Oliver Bieri, Liestal (CH); Klaus Scheffler, Basel (CH)

(73) Assignee: University Hospital of Basel, Basel (CH)

( * ) Notice: Subject to any disclaimer, the term of this patent is extended or adjusted under 35 U.S.C. 154(b) by 364 days.

(21) Appl. No.: 12/732,678

(22) Filed: Mar. 26, 2010

(65) Prior Publication Data
US 2011/0234224 A1  Sep. 29, 2011

(51) Int. Cl.
*G01V 3/00* (2006.01)
(52) U.S. Cl. .................... 324/309; 324/307
(58) Field of Classification Search ......... 324/300–322; 600/407–445
See application file for complete search history.

(56) References Cited

U.S. PATENT DOCUMENTS

| | | | |
|---|---|---|---|
| 6,922,054 B2 | 7/2005 | Hargreaves et al. | |
| 7,078,903 B2 | 7/2006 | Paliwal et al. | |
| 7,096,056 B2 | 8/2006 | Miller et al. | |
| 7,265,547 B2 * | 9/2007 | Vu .................. | 324/309 |
| 7,443,162 B2 * | 10/2008 | Deimling .................. | 324/307 |
| 7,567,081 B2 * | 7/2009 | Bieri et al. .................. | 324/309 |
| 8,060,180 B2 * | 11/2011 | Pai .................. | 600/410 |

OTHER PUBLICATIONS

Leupold et al., "Alternating repetition time balanced steady state free precession," in Magnetic Resonance in Medicine, vol. 55(3), 2006, pp. 557-565.
Scheffler, "A pictorial description of steady-states in rapid magnetic resonance imaging," in Concepts in Magnetic Resonance, vol. 11(5), 1999, pp. 291-304.
Scheffler, "Detection of BOLD changes by means of a frequency-sensitive trueFISP technique: preliminary results," in NMR in Biomedicine, vol. 14(7-8), 2001, pp. 490-496.
Miller et al., "Functional brain imaging using a blood oxygenation sensitive steady state," in Magnetic Resonance in Medicine, vol. 50(4), 2003, pp. 675-683.
Scheffler, "Fast frequency mapping with balanced SSFP: Theory and application to proton-resonance frequency shift thermometry," in Magnetic Resonance in Medicine, vol. 51(6), 2004, pp. 1205-1211.
Vasanawala et al., "Fluctutaing equilibrium MRI," in Magnetic Resonance in Medicine, vol. 42(5), 1999, pp. 876-883.
Carr, "Steady-state free precession in nuclear magnetic resonance," in Physical Review, vol. 112(5), Dec. 1, 1958, pp. 1693-1708.

* cited by examiner

*Primary Examiner* — Brij Shrivastav
(74) *Attorney, Agent, or Firm* — Joyce von Natzmer; Agris & von Natzmer LLP

(57) ABSTRACT

Apparatus and methods for modification of the frequency response profile of steady-state free precession (SSFP) type of magnetic resonance imaging (MRI) sequences. Using alternating dephasing moments within succeeding radiofrequency (RF) excitation pulses, the frequency response function of SSFP sequences can be modified to different shapes such as near triangular or bell shaped. The particular response function as produced by alternating dephasing moments can be used, among others, for functional brain MRI, MR spectroscopy or spatial encoding.

14 Claims, 9 Drawing Sheets

(a) (b) (c)

(a) (b)

MODIFICATION OF FREQUENCY RESPONSE PROFILES OF STEADY STATE FREE PRECESSION FOR MAGNETIC RESONANCE IMAGING (MRI)

FIELD OF THE INVENTION

This invention relates to methods for modifying frequency response profiles of steady state free precession (SSFP) sequences in magnetic resonance imaging (MRI). The invention also relates to apparatuses for executing these methods. Certain embodiments of the invention allow for the detection of temperature changes, for functional MRI (fMRI) of the brain, MR spectroscopy and/or spatial encoding.

BACKGROUND OF THE INVENTION

Since their introduction in 1958 by Can (Carr, 1958), nuclear magnetic resonance imaging (NMR) steady state free precession (SSFP) sequences have, in particular during the last two decades, become increasingly popular for magnetic resonance imaging (MRI) primarily since they combine fast imaging capabilities with high signal-to-noise (Haacke, 1999).

The publications and other materials, including patents, used herein to illustrate the invention and, in particular, to provide additional details respecting the practice are incorporated herein by reference. For convenience, the non-patent publications are referenced in the following text by author and date and are listed in the appended bibliography.

Generally, there are three major groups of SSFP sequences (Scheffler, 1999), RF-spoiled and gradient-spoiled SSFP (SPGR), gradient-spoiled SSFP (non-balanced SSFP: nbSSFP, see FIG. 1a and also U.S. Pat. No. 7,567,081)) and non-RF spoiled non-gradient-spoiled SSFP (balanced SSFP: bSSFP, see FIG. 1b) sequences. In the context of the present invention, the two latter types of SSFP sequences are of particular relevance, namely, nbSSFP and bSSFP. Non-balanced SSFP sequences are generally used for musculoskeletal imaging, since they are insensitive to off-resonances (see FIG. 1a) and offer an excellent fluid to tissue contrast. However, they suffer from motion-related image artifacts. Balanced SSFP sequences are generally used for cardiovascular imaging, since they are motion insensitive. However, they suffer from off-resonance related signal modulations (see FIG. 1b). The frequency response profile (also referred to herein as frequency response function, in particular, its phase and/or amplitude, of bSSFP type sequences has been successfully used for generating functional blood-oxygen-level dependent (BOLD) MRI contrast to assess brain activity (Scheffler et al, 2001; Miller et al, 2003; see also U.S. Pat. No. 7,096,056) and for temperature mapping (Scheffler et al, 2004; see also U.S. Pat. No. 7,078,903). In addition, two methods are known for modulating frequency response profiles of bSSFP which use either alternating repetition times (Leupold et al, 2006) or higher order radio-frequency (RF) phase cycling with identical time of repetition (TR) (Vasanawala et al, 1999; see also U.S. Pat. No. 6,922,054). The particular frequency response functions can be used to map biochemical of biophysical tissue properties within short acquisition times (as achieved with SSFP type of sequences).

However, it is clear that there is a need for additional and/or improved methods and/or apparatuses for generating frequency response profiles that allow mapping functional, biochemical or biophysical tissue information. This invention fulfills, in certain embodiments, one or more of these needs as well as other needs in the art which will become more apparent to the skilled artisan once given the following disclosure.

SUMMARY OF THE INVENTION

Generally speaking, this invention fulfills, in certain embodiments, the above described needs in the art by furnishing a method of magnetic resonance imaging (MRI) comprising:
providing a characteristic frequency response function for steady state free precession sequences by producing two alternating "kernels:
During odd (or even) TR intervals, spin isochromats are dephased creating a nb-SSFP (nb-SSFP TR interval), while they are rephased during even (or odd) TR intervals creating a b-SSFP (b-SSFP TR interval).

As a result of these alternating dephasing moments, the frequency response function for the bSSFP kernels (but also for the nbSSFP kernels) are modified.

In a preferred embodiment, a triangular frequency response function is generated within the bSSFP kernel using identical flip. In another preferred embodiment, a frequency response function is generated within the bSSFP kernel that has near harmonic (generally sinoidal or cosinusoidal) oscillation in the amplitude and linear phase sweeps using diverging flip angles.

The so generated frequency response profiles can be used to detect frequency changes in a sample, such as, but not limited to, frequency modulations induced by temperature changes or by functional neural activation in the brain. In addition, the generated frequency response profiles can be used to resolve different resonance frequencies in spectroscopic imaging experiments.

The present invention is directed at a MRI (magnetic resonance imaging) method comprising:
- subjecting a sample to a Chimera steady-state free precession (ch-SSFP) protocol,
- said ch-SSFP protocol comprising a sequence of two alternating TR-intervals,
- wherein one of said two TR-intervals is a nb-SSFP TR interval which comprises dephasing spin isochromats to create a non-balanced steady-state free precession (nb-SSFP),
- wherein another of said two TR-intervals is a b-SSFP TR interval which comprises rephasing spin isochromats to create a balanced steady-state free precession (b-SSFP),
- wherein said ch-SSFP has a frequency response profile during the b-SSFP TR interval, which correlates an amplitude and/or phase to a frequency, and
- wherein the amplitude and/or phase is altered by frequency changes resulting from said sample.

The amplitude of the frequency response profile created during the bSSFP TR may change linearly with the frequency when the flip angles of the nb-SSFP TR-interval and the b-SSFP TR-interval are the same, generally to create a triangular frequency response profile.

The phase of the frequency response profile created during the b-SSFP TR may changes linearly with the frequency, while the amplitude of the frequency response profile created during said bSSFP TR may changes harmonically, i.e., sinoidal or cosinusoidal, with the frequency when the flip angle of the nb-SSFP TR-interval and the b-SSFP TR-interval differ, generally to create a bell shaped frequency response profile with the amplitude harmonically oscillating.

The amplitude may increase or decrease with said frequency change and is, in preferred embodiments, proportional to a signal measurable to detect said frequency change.

The flip angles of the of the nb-SSFP and the b-SSFP TR intervals may be the same, preferably between 0° to 60°, between 10° and 40°, preferably less than or about 30°, less than or about 20° or less than or about 10°.

The flip angles of the nb-SSFP and the b-SSFP TR intervals may also differ. In this case, flip angle ($\alpha_{nb}$) of said nb-SSFP TR-interval may be between 0° and 60°, 10° and 60°, preferably about 10°, 20°, 30°, 40°, 50° or 60° and the flip angle ($\alpha_b$) of said b-SSFP TR-intervals may be between 0° and 60°, 10° and 60°, preferably about 10°, 20°, 30°, 40°, 50° or 60°. In certain embodiments, the difference between $\alpha_{nb}$ and $\alpha_b$ is about 10°, 20°, 30°, 40° or 50°.

An alternating pair of a nb-SSFP combined with a b-SSFP TR-interval lasts, in certain embodiments, no longer than about 50 ms, preferably no longer than about 40 ms, more preferably no longer than about 30, about 20, about 10 or about 5 ms.

The time ratio of the b-SSFP TR interval to the nb-SSFP TR interval may be between about 0.5 to 500, preferably 1 to 200.

In certain embodiments, two or three orthogonal phase encoding gradients, respectively, spatially encode a spectral signal during readout in the b-SSFP TR-interval to provide a two dimensional (2D) or three dimensional (3D) spectroscopic image.

Frequency change may be induced by a difference in a first and second region of said sample in (i) temperature (for temperature mapping), (ii) blood oxygen level (to create a blood oxygen level dependent (BOLD) contrast for functional MRI (fMRI)) or (iii) susceptibility (i.e., magnetic susceptibility of different materials (e.g. bone vs. soft tissue)).

As the person skilled in the art will recognize, a wide variety of sample may be employed, including, but not limited to brain or spinal cord.

Difference in temperature in said first region and said second region of as low as 1° C. may be detected by the above methods. A BOLD response of as high as 10% may be generated using certain embodiments of the present invention.

In certain embodiments, dephasing induced within the nb-SSFP TR interval may be flow or motion compensated.

Also, the frequency change may induce a negative or positive phase advance of a phase offset within the b-SSFP TR interval. The phase advance may alter the amplitude. The altered amplitude may provide a signal to assess the frequency change. The phase offset may hereby be 90° or 180°.

DETAILED DESCRIPTION OF CERTAIN EMBODIMENTS

For a more complete understanding of the present invention and advantages thereof, references is now made to the following description of various illustrative and non-limiting embodiments thereof, taken in conjunction with the accompanying drawings.

Magnetic resonance imaging, hereinafter "MRI" (and more generically referred to as nuclear magnetic resonance imaging or "NMR"), is a method of generating images which utilizes the detection of the relaxation properties of excited atomic nuclei then exposes the nuclei to pulses of electromagnetic energy (excitation/gradient pulses, radio frequency or "RF" pulses) in order to force the nuclei to temporarily assume non-aligned, higher energy states. In such methodologies, changes in energy states, as they are effected by the application of magnetic and RF fields, are measured and/or detected and then assimilated into images.

Although images produced by known MRI techniques are adequate in many applications, improvements in mapping functional, biochemical and/or biophysical tissue information are desired.

Figure 1:
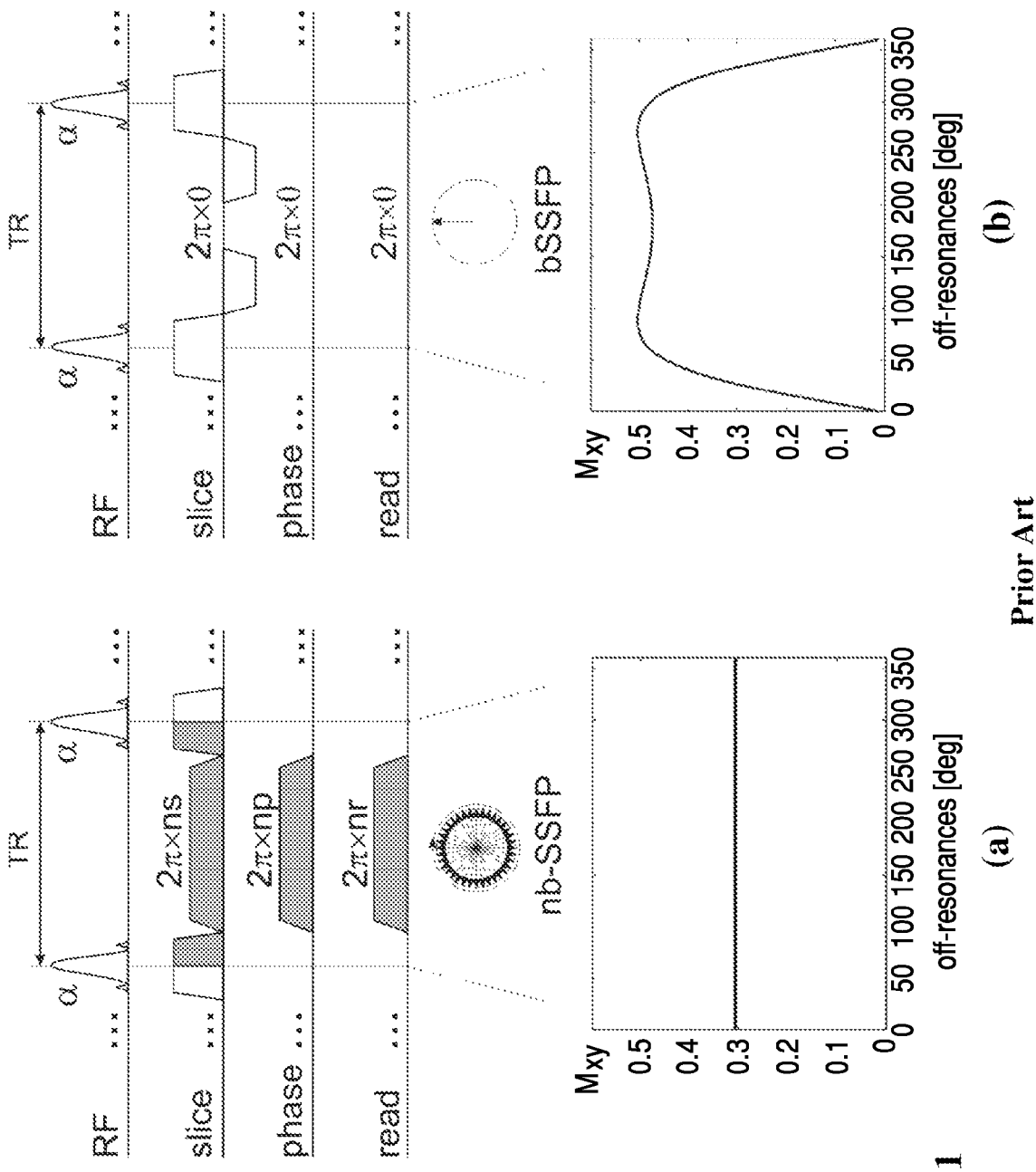
FIG. 1: (a) Basic sequence scheme for a gradient-spoiled, i.e. non-balanced, steady state free precession (nb-SSFP). Within this scheme, dephasing of isochromats within a voxel is $2\pi$ or more. As a result of the dephasing, this type of sequence is insensitive to off-resonances, as indicated by its frequency response function (T1=T2=300 ms, $\alpha$=70°. (b) Basic sequence scheme for a non gradient-spoiled, i.e. balanced, steady state free precession (bSSFP). Within this scheme, no dephasing is induced by gradients, but the sequence shows a particular frequency response function, which depends on the flip angle ($\alpha$) and the ratio of the relaxation time (T2, T1).

FIG. 1, in this regard, illustrates one example of a prior art SSFP sequence schemes (nbSSFP and bSSFP) used for MRI image acquisition.

Figure 2:
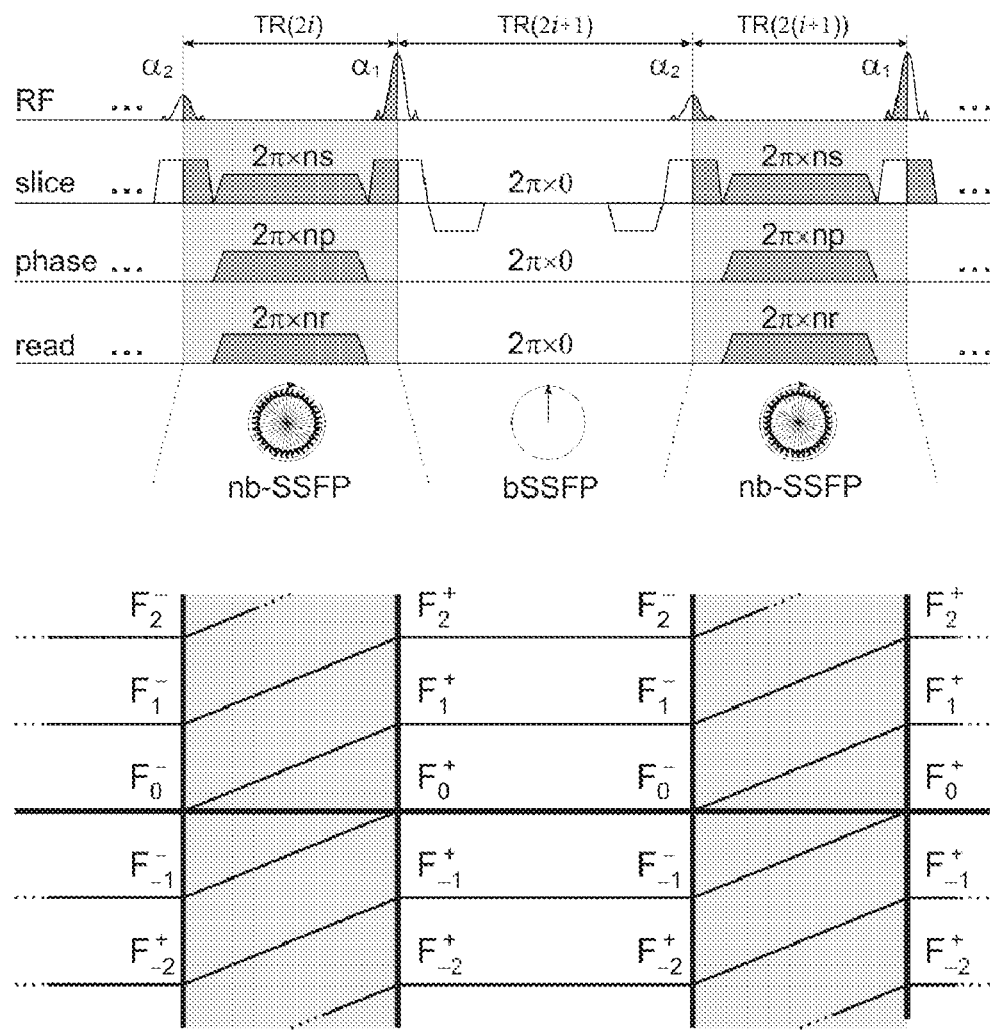
FIG. 2: Illustration of the basic concept for Chimera SSFP. The sequence comprises a sequence of two alternating SSFP kernels (see FIG. 1): odd (even) TR-intervals undergo gradient dephasing (nb-SSFP, FIG. 1a) (nb-SSFP TR-interval) whereas even (odd) TR-intervals feature a balanced SSFP type of protocol (bSSFP, FIG. 1b) (b-SSFP TR interval).

This invention relates to a new type of steady-state free precession (SSFP) sequence which combines these prior art SSFP sequences to provide characteristic frequency response profiles, which are called herein "Chimera SSFPs" (see FIG. 2). A chimera SSFP comprises usually a sequence of two alternating SSFP kernels: odd (even) TR-intervals (or bSSFP TR intervals) feature a balanced SSFP (bSSFP, which is characterized by fully refocused isochromats at the end of TR) type of protocol, whereas the alternating even (odd) TR-intervals (or nbSSFP TR intervals) undergo gradient dephasing (non-balanced SSFP, which is characterized by various amounts of dephasing along all physical axes by multiples, ns, np, nr of $2\pi$), which accounts for the name. As readily apparent to the person skilled in the art, whether the bSSFP type protocol is followed by the nbSSFP protocol or vice versa is irrelevant in the context of the present invention as long as they alternate (bSSFP-nbSSFP-bSSFP etc. or nbSSFP-bSSFP-nbSSFP etc.) with each other.

Figure 3:
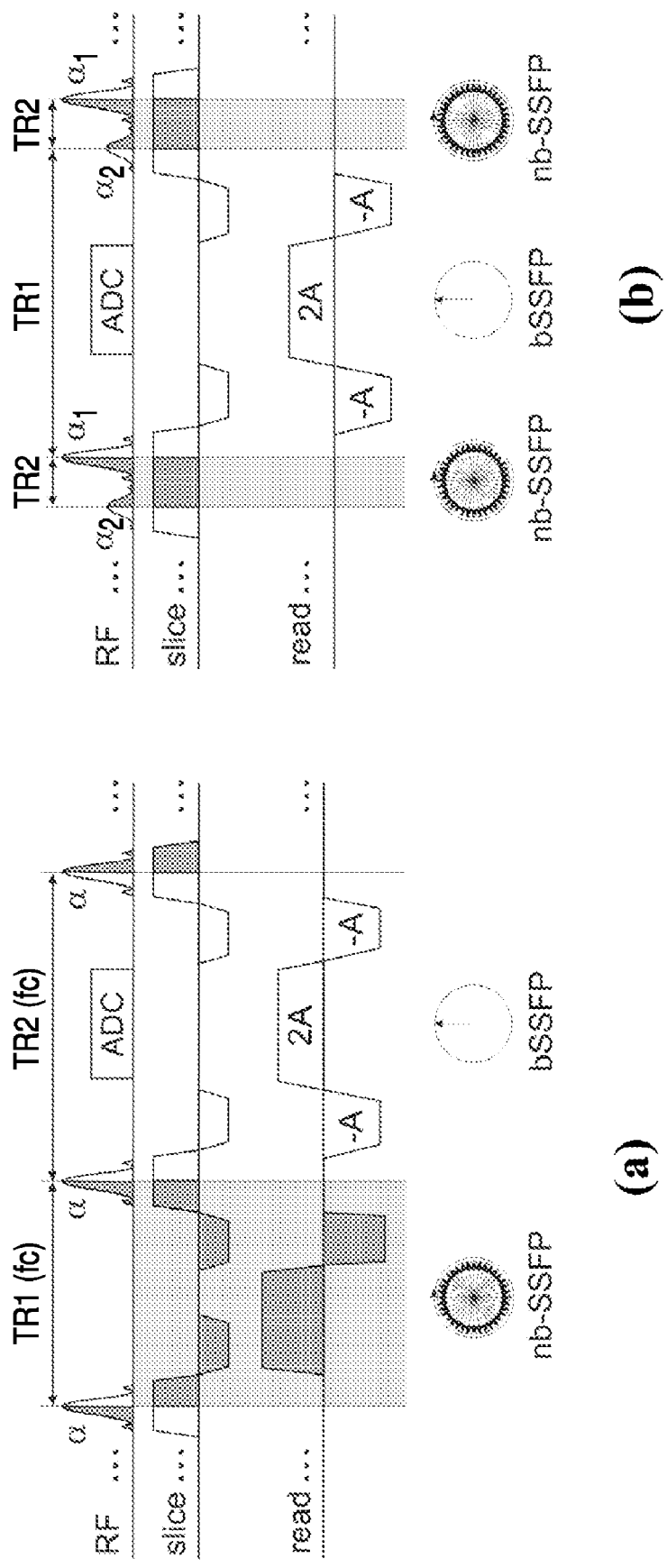
FIG. 3: Two embodiments of Chimera SSFP. (a) This embodiment features identical RF pulses for the nb-SSFP TR and b-SSFP TR intervals and the dephasing induced within the nb-SSFP kernel (or nb-SSFP TR interval) is flow or motion compensated (i.e., without flow or motion sensitivity). (b) This embodiment features a minimal repetition time (TR2) for the nb-SSFP kernel and a variable flip angle between odd and even TR intervals. For two RF pulse durations ("TRF1", "TRF2"), the minimal TR2 is given by (TRF1+TRF2)/2.

In certain embodiments such as the one shown in FIG. 3a, the dephasing moments within the nbSSFP kernel can be flow or motion compensated as indicated by the bipolar dephasing gradient on the read axis. The embodiment shown in FIG. 3a also uses identical radiofrequency (RF) excitation pulses for the nbSSFP kernel (or nbSSFP TR interval) and the bSSFP kernel (or bSSFP TR interval). If only the signal generated within the bSSFP kernel is used for readout, the repetition time for the nbSSFP kernel can be drastically reduced, nearly approaching zero, as displayed in FIG. 3b. In particular, for two RF pulse durations ("TRF1" and "TRF2"), the minimal TR is provided by (TRF1+TRF2)/2. The embodiment shown in FIG. 3b, not only shortens the repetitions time, but also displays differing, alternating flip angles. A flip angle $\alpha_1$ of between 0° and 60°, preferably 10° and 60°, more preferably about 10°, 20°, 30°, 40°, 50° or 60° can, for example, be combined with a flip angle $\alpha_2$ between 10° and 60°, preferably about 10°, 20°, 30°, 40°, 50° or 60°.

Figure 4:
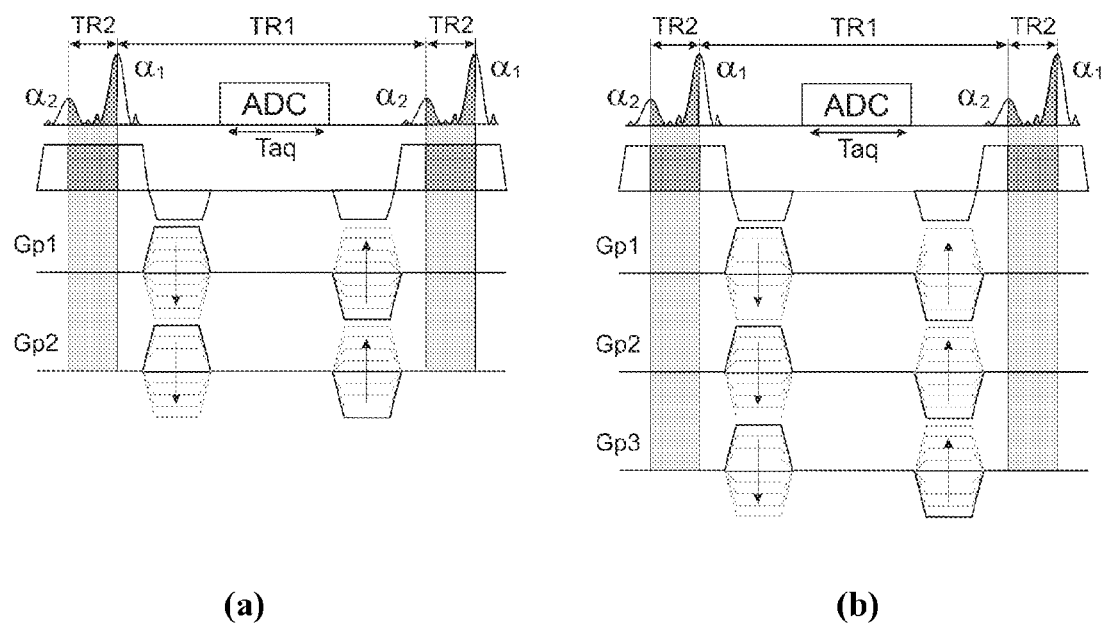
FIG. 4: Chimera SSFP variants for 2D and 3D spectroscopic imaging. (a) The signal acquisition is spectroscopic and lacking a read gradient using two-dimensional spatial encoding of the special signal acquired during the period Taq (Time of acquisition or signal recording time). The special encoding is produced by stepwise variation of phase encoding gradients Gp1 and Gp2 each in orthogonal directions. (b) Chimera SSFP with 3D spectroscopic encoding using three mutually orthogonal phase encoding gradients Gp1, Gp2, and Gp3 that are varied stepwise. The spectral resolution is determined by 1/Taq, the spectral width sampling density $\Delta$Taq by Taq/(number of acquisition samples). The signal intensities depend on the resonance frequency, i.e. the signal intensities are modulated by the corresponding frequency response function.

FIG. 4 shows several variants of the Chimera SSFP sequence for 2D and 3D spectroscopic imaging/chemical shift imaging (CSI). CSI is an extension of MR spectroscopy allowing metabolite information to be measured in an extended region. The signal is acquired during the period Taq with a sampling rate of $1/\Delta Taq$. Different resonances or metabolites can be differentiated according to the principle of chemical shift imaging using a Fourier transformation of the acquired Chimera SSFP signal. According to the Nyquist theorem, the spectral width or bandwidth of the acquired signal is $1/\Delta Taq$ and the resulting spectral resolution is $1/Taq$. In order to optimize signal-to-noise, the repetition time TR1+TR2 is in the order of about 1-about 50 ms, including about 5, about 10, about 20, about 30 or about 40 ms, corresponding to a spectral resolution of 20-1000 Hz. In contrast to known CSI methods, the signal intensity of different resonances is weighted by the frequency response profile of Chimera SSFP as shown in FIG. 5.

Figure 5:
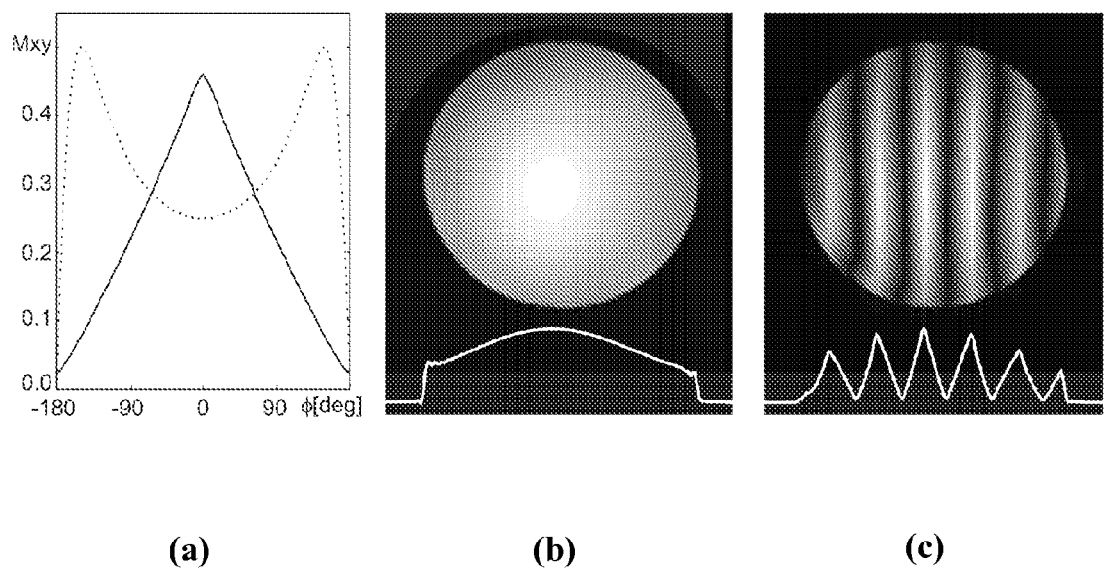
FIG. 5: Frequency response function and sample images for bSSFP (FIG. 1b) and Chimera SSFP (FIG. 3a) for T1~T2=300 ms, $\alpha$=30° with TR1=TR2=5 ms. (a) BSSFP frequency response profile (dotted line) and Chimera SSFP frequency response profile (solid line). The frequency response of Chimera SSFP is of triangular shape. (b) Sample image from bSSFP with corresponding intensity profile using 0° phase offset. (c) Sample image using Chimera SSFP in the presence of a linear frequency offset (left-to-right) with corresponding intensity profile to reveal the triangular response function.

Chimera SSFP can be used to generate characteristic frequency response profiles with respect to the bSSFP interval as shown in FIG. 5 (using T1~T2=300 ms, $\alpha_1=\alpha_2=30°$, TR(nb-SSFP)=TR(bSSFP)=5 ms). Using the embodiment in FIG. 3a, in combination with identical RF excitation angles $\alpha_1=\alpha_2=30°$, generates for chimera SSFP a frequency response function of substantially triangular shape (solid line in FIG. 5a). The amplitude of the triangle depends on the repetition time ratio TR1/TR2 and increases with decreasing ratios (not shown). A 2D sample image of Chimera SSFP and corresponding intensity profile is shown in FIG. 5c. The particular shape of the frequency response function reveals itself in the presence of a linear frequency offset (FIG. 5c).

Figure 6:
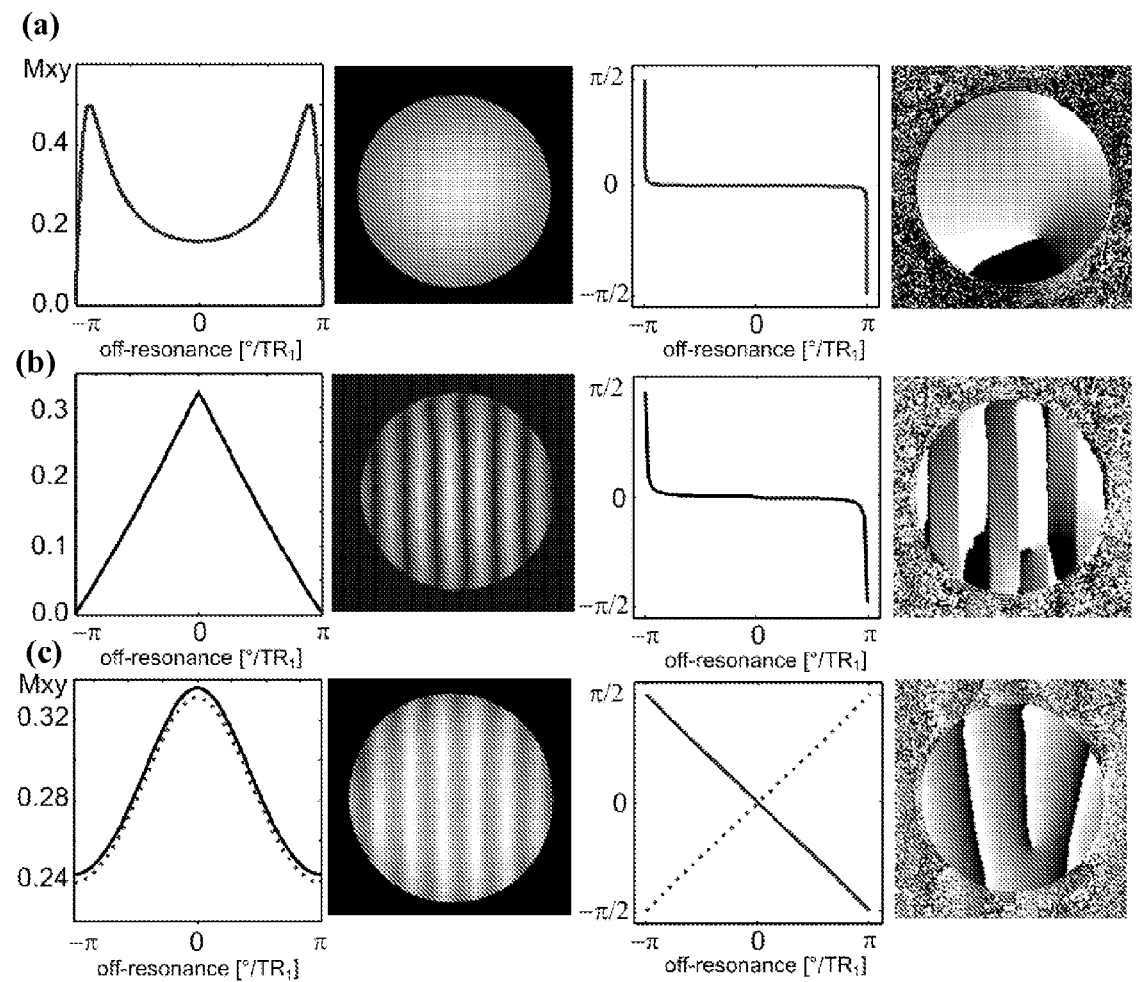
FIG. 6: Simulated phase and amplitude modulations of Chimera SSFP as a function of off-resonances (top (a)): balanced SSFP with TR=2TE=5 ms, $\alpha$=20° and T1=T2=1 sec; (middle (b)): Chimera SSFP with TR1=5 ms, TR2=0.5 ms, $\alpha_1$=20° and $\alpha_2$=20°; (bottom (c)): Chimera SSFP with TR1=5 ms, TR2=0.5 ms, $\alpha_1$=10°, $\alpha_2$=60° (shown in as dotted line) and $\alpha_1$=60°, $\alpha_2$=10° (shown as solid line). In addition, on the right Chimera SSFP phase and magnitude images (aqueous probe with T2/T1=260/290 ms) are shown with scan parameters identical to the simulation.
Figure 7:
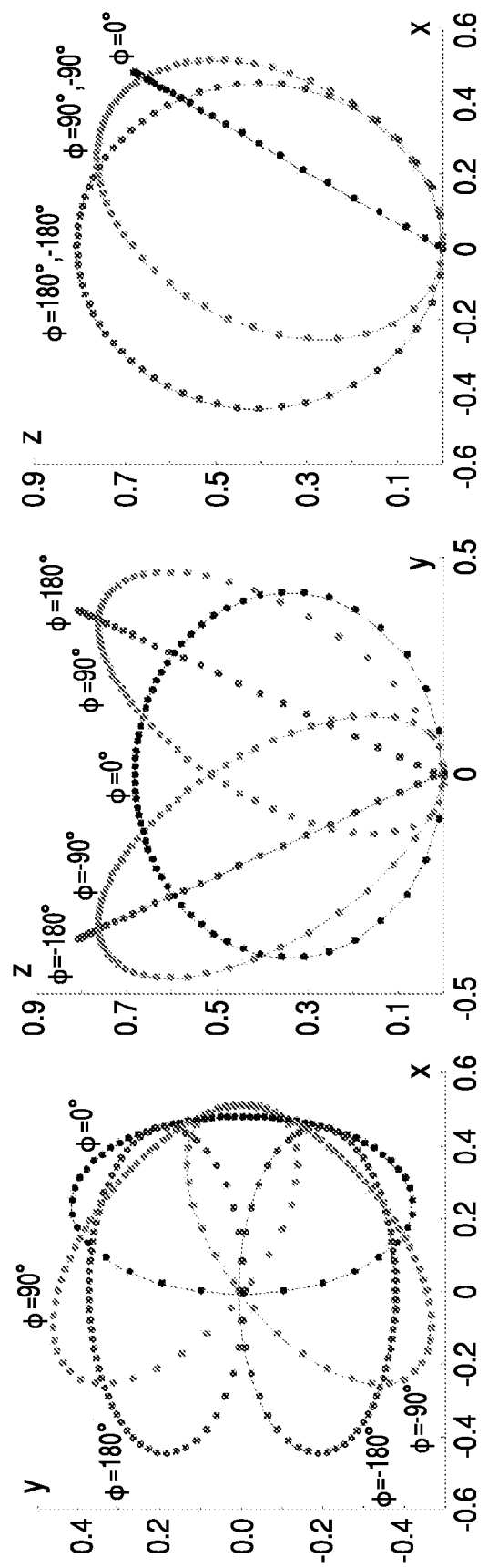
FIG. 7: Steady-state configurations for Chimera SSFP as shown in FIG. 1 as a function of off-resonances ($\phi$) for diverging flip angles ($\alpha_1$=10° and $\alpha_2$=60°). With increasing off-resonances, the on-resonance configuration is rotated around the longitudinal axis (z-axis) by $\phi/2$. As a result a near harmonic signal oscillation is induced (see FIG. 2, bottom).

Similarly, the embodiment as given in FIG. 3b, generates for Chimera SSFP with $\alpha_1=\alpha_2=20°$, a frequency response of near triangular shape (FIG. 6, middle (b)). However, for diverging flip angles $\alpha_1=10°$ (or 60°) and $\alpha_2=60°$ (or 10°) the frequency response profile oscillates around an amplitude offset (FIG. 6, bottom (c)). The phase of the steady-state with Chimera SSFP is identical to the bSSFP phase profile for identical flip angles but increases linearly for diverging flip angles, similar to gradient echo sequences. Amplitude modulations for Chimera SSFP with diverging flip angles are near harmonic, which is a consequence of the rotation of the magnetization configuration as displayed in FIG. 7.

For illustrative purposes of a possible use of the particular triangular shape of the frequency response function of Chimera SSFP, two possible applications will now be given and illustrated, namely functional MRI (fMRI) and temperature mapping.

EXAMPLE I

Functional MRI

Figure 8:
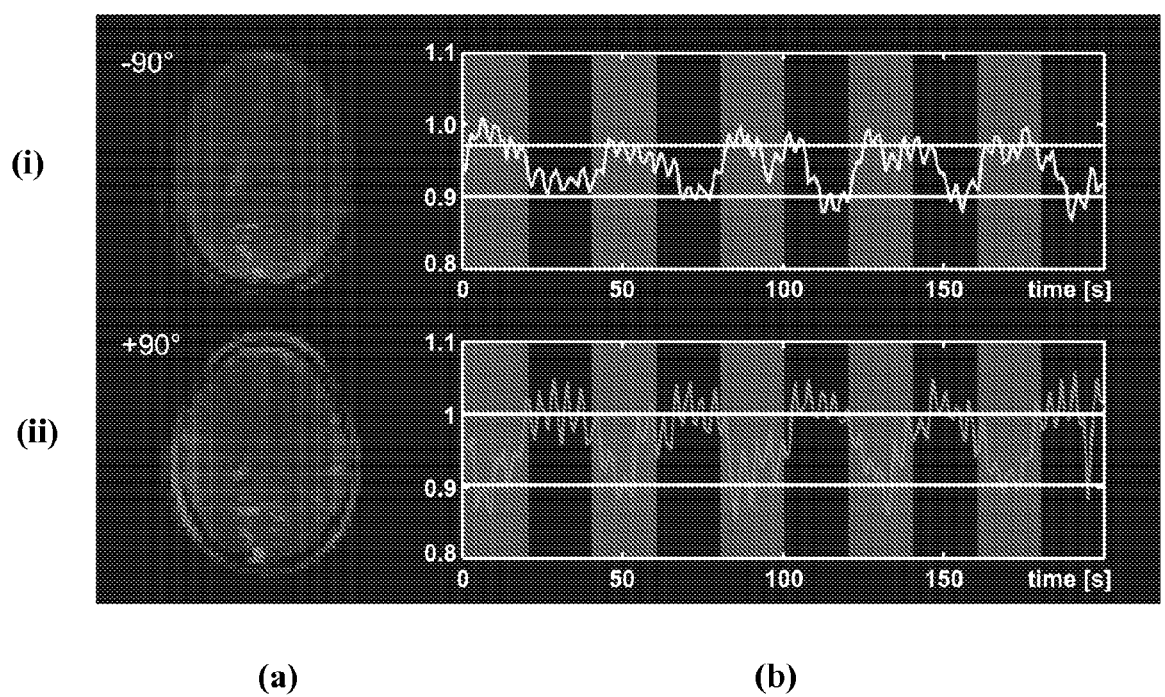
FIG. 8: Chimera fMRI. Pixels in the visual cortex that displayed a correlation coefficient >0.3 were classified as being active (left (a)) with corresponding average signal time courses (right (b)). The upper (i)/lower (ii) row show the results for a negative/positive phase advance of 90°.

Using the embodiment of the invention as presented in FIG. 3a, neuronal activity can be mapped generating a functional image contrast (fMRI). Here, the Chimera SSFP makes use of the frequency related shift, identical with the well-known existing frequency sensitive fMRI acquisition techniques based on SSFP (Scheffler, 2001; Miller, 2003). Since non-balanced SSFP is moderately sensitive to flow or motion, dephasing moments within TR2 were flow compensated (to TR). FMRI data was acquired with a standard block design (20 s/20 s on/off) using a visual stimulus (checkerboard). Pixels in the visual cortex that showed a correlation coefficient >0.3 (FIG. 8(a)) were classified as being active and corresponding average signal time courses (FIG. 8(b)). FMRI Chimera sequence parameters were: TR1=3 ms, TR2=6 ms, $\alpha_1=\alpha_2=20°$, using two scans with phase offset of ±90° from on-resonance. The time resolution of the Chimera fMRI scan was 1 sec using a slice thickness of 5 mm and a 64×64 matrix (yielding 4×4 mm in plane resolution)

EXAMPLE II

Temperature Mapping

Figure 9:
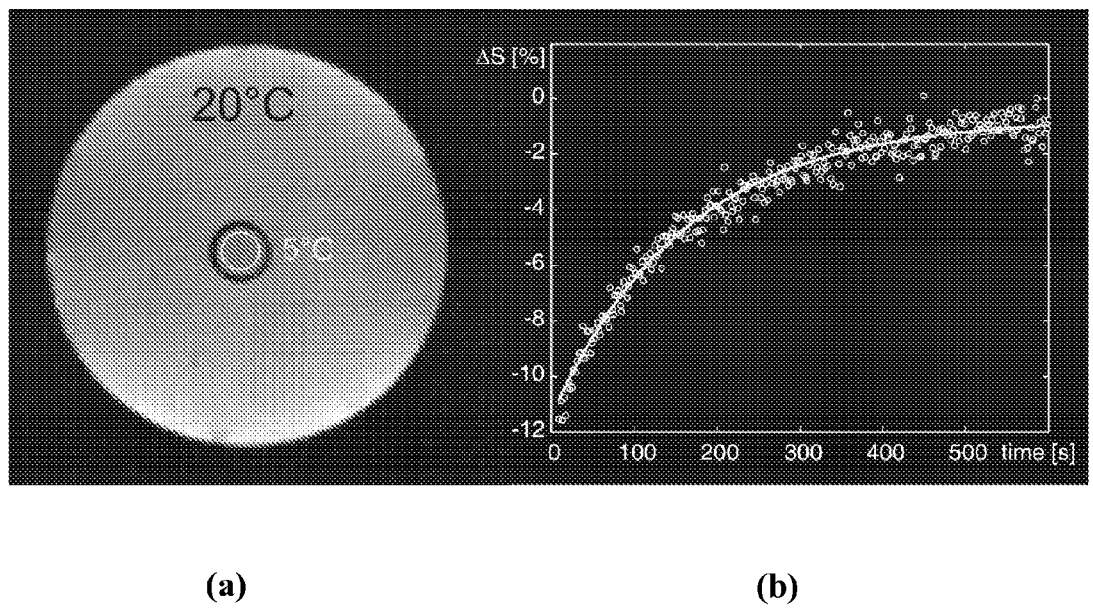
FIG. 9: Temperature mapping using Chimera SSFP with 90° phase offset. Image (a) on the left shows a Chimera SSFP scan immediately after placing a test tube (equilibrated at 5° C.) in the center of a spherical holder (equilibrated at 20° C.). Dissipation followed an exponential behavior with a time constant of roughly 1/160 sec. On the right (b) the corresponding measurements are shown.

Similarly, temperature changes can be mapped using an embodiment analogous to FIG. 3a: A test tube filled with a viscous aqueous solution (with relaxation times T1~1 s, T2~40 ms) was equilibrated at −5° C. The image shown in FIG. 9a shows a Chimera SSFP scan immediately after mounting the test tube into a spherical holder (essentially containing the same solution and equilibrated in the scanner at a room temperature of 20° C.). The temperature in the surrounding of the test tube is thus elevated by 15°. Temperature scans were acquired using TR1=8 ms, TR2=8 ms, $\alpha_1=\alpha_2=20°$ with a temporal resolution of 1 sec/scan. At 1.5 T, a frequency shift of 0.01 ppm/° C. yields approximately 0.23°/ms phase advance. This corresponds to a phase advance of about 28°/TR (TR1=8 ms). As a result, an initial signal difference ($\Delta S$) of about $\Delta S=100\% \cdot (28/180)=15\%$ can be expected. This is in good agreement with measurements (FIG. 9b).

EXAMPLE III

CSI

Imaging of different resonance frequencies of metabolites can be achieved using the embodiment of the invention as presented in FIG. 4a or 4b. In this case the echo signal acquired during the readout gradient is the complex sum of all resonance frequencies or metabolites present in the sample, weighted with their corresponding Chimera SSFP frequency profile. To produce chemical shift selective images of each resonance of the metabolites for known resonance frequencies, in a preferred implementation, the acquisition can be carried out such that acquisition is repeated in several steps such that in each individual acquisition each signal is differently weighted by the Chimera SSFP frequency profile. Different weighting is achieved by using different linear phase increments $\phi$ of the excitation pulses for each individual acquisition such that the resulting frequency profile is shifted in frequency direction by a certain amount. For each individual acquisition the measured echo amplitude becomes a function of the applied linear phase increment $\phi$ of the excitation pulses. The intensity of the individual resonances can then be calculated via appropriate algorithms through solution of the corresponding linear equation system.

Once given the above disclosure, many other features, modifications, and improvements will become apparent to the skilled artisan. Such other features, modifications, and improvements are therefore considered to be part of this invention, the scope of which is to be determined by the following claims.

Bibliography

Carr H Y. Steady-state free precession in nuclear magnetic resonance. Phys Rev 1958; 112(5):1693-1701.

Haacke E, Brown R, Thompson M, Venkatesan R. Magnetic Resonance Imaging: Physical Principles and Sequence Design: Wiley; 1999.

Leupold J, Hennig J, Scheffler K. Alternating repetition time balanced steady state free precession. Magn Reson Med 2006; 55(3):557-565.

Miller K L, Hargreaves B A, Lee J, Ress D, deCharms R C, Pauly J M. Functional brain imaging using a blood oxygenation sensitive steady state. Magn Reson Med 2003; 50(4):675-683

Scheffler K. A pictorial description of steady-states in rapid magnetic resonance imaging. Concepts in Magnetic Resonance 1999; 11(5):291-304.

Scheffler K, Seifritz E, Bilecen D, Venkatesan R, Hennig J, Deimling M, Haacke E M. Detection of BOLD changes by means of a frequency-sensitive trueFISP technique: preliminary results. NMR Biomed 2001; 14(7-8):490-496.

Scheffler K. Fast frequency mapping with balanced SSFP: theory and application to proton-resonance frequency shift thermometry. Magn Reson Med 2004; 51(6):1205-1211.

Vasanawala S S, Pauly J M, Nishimura D G. Fluctuating equilibrium MRI. Magn Reson Med 1999; 42(5):876-883.

What we claim is:

1. A MRI (magnetic resonance imaging) method comprising:
    subjecting a sample to a chimera steady-state free precession (ch-SSFP) protocol, said ch-SSFP protocol comprising a sequence of two alternating TR-intervals,
        wherein one of said two TR-intervals is a nb-SSFP TR interval which comprises dephasing spin isochromats to create a non-balanced steady-state free precession (nb-SSFP),
        wherein another of said two TR-intervals is a b-SSFP TR interval which comprises rephasing spin isochromats to create a balanced steady-state free precession (b-SSFP),
        wherein said ch-SSFP has a frequency response profile during the b-SSFP TR interval, which correlates an amplitude and/or phase to a frequency, and
        wherein the amplitude and/or phase is altered by frequency changes resulting from said sample.

2. The MRI method of claim 1, wherein
    (a) the amplitude of the frequency response profile created during the bSSFP TR changes linearly with the frequency when the flip angles of the nb-SSFP TR-interval and the b-SSFP TR-interval are the same, or
    (b) the phase of the frequency response profile created during the b-SSFP TR changes linearly with the frequency, while the amplitude of the frequency response profile created during said bSSFP TR changes harmonically with the frequency when the flip angle of the nb-SSFP TR-interval and the b-SSFP TR-interval differ.

3. The MRI method of claim 2, wherein the said amplitude increases or decreased with said frequency change and is proportional to a signal measurable to detect said frequency change.

4. The MRI method of claim 2, wherein the flip angles of the nb-SSFP and the b-SSFP TR intervals are the same and are between 0° to 60°, between 10° and 40°, preferably less than or about 30°, less than or about 20° or less than or about 10°.

5. The MRI method of claim 2, wherein the flip angles of the nb-SSFP and the b-SSFP TR intervals differ and wherein the flip angle ($\alpha_{nb}$) of said nb-SSFP TR-interval is between 0° and 60°, preferably about 10°, 20°, 30°, 40°, 50° or 60° and the flip angle ($\alpha_b$) of said b-SSFP TR-intervals is between 0° and 60°, preferably about 10°, 20°, 30°, 40°, 50° or 60°.

6. The MRI method of claim 5, wherein the difference between a $\alpha_{nb}$ and $\alpha_b$ is about 10°, 20°, 30°, 40° or 50°.

7. The MRI method of claim 1, wherein an alternating pair of a nb-SSFP combined with a b-SSFP TR-interval lasts no longer than about 50 ms, preferably no longer than about 40 ms, more preferably no longer than about 30, about 20, about 10 or about 5 ms.

8. The MRI method of claim 7, wherein the time ratio of the b-SSFP TR interval to the nb-SSFP TR interval is between about 0.5 to 500, preferably 1 to 200.

9. The MRI method of claim 1, wherein two or three orthogonal phase encoding gradients, respectively, spatially encode a spectral signal during readout in b-SSFP TR-interval to provide a two dimensional (2D) or three dimensional (3D) spectroscopic image.

10. The MRI method of claim 1, wherein said frequency change is induced by a difference in a first and second region of said sample in (i) temperature, (ii) blood oxygen level or (iii) susceptibility.

11. The MRI method of claim 1, wherein the dephasing induced within the nb-SSFP TR interval is flow or motion compensated.

12. The MRI method of claim 1, wherein the frequency change induces a negative or positive phase advance of a phase offset within the b-SSFP TR interval and wherein said phase advance alters the amplitude.

13. The MRI method of claim 12, wherein the altered amplitude provides a signal to assess the frequency change.

14. The MRI method of claim 12, wherein the phase offset is 90° or 180°.

* * * * *